United States Patent [19]

Holl et al.

[11] Patent Number: 5,748,827

[45] Date of Patent: May 5, 1998

[54] TWO-STAGE KINEMATIC MOUNT

[75] Inventors: Mark R. Holl, Seattle; Roya R. Sabeti, Tacoma, both of Wash.

[73] Assignee: University of Washington, Seattle, Wash.

[21] Appl. No.: 736,336

[22] Filed: Oct. 23, 1996

[51] Int. Cl.⁶ .................................................. G02B 6/00
[52] U.S. Cl. .......................... 385/134; 385/136; 385/137; 385/147
[58] Field of Search ................................. 385/14, 49, 50, 385/51, 134, 136, 137, 147

[56] References Cited

U.S. PATENT DOCUMENTS

| | | | |
|---|---|---|---|
| 4,825,086 | 4/1989 | Mueller | 250/491.1 |
| 5,128,280 | 7/1992 | Matsumoto | 437/203 |
| 5,167,464 | 12/1992 | Voellmer | 403/13 |
| 5,297,228 | 3/1994 | Yanagawa et al. | 385/129 |

OTHER PUBLICATIONS

Braddick, H.J.J. (1960), *Mechanical Design of Laboratory Apparatus*, Chapman and Hall Limited, London:Reinhold Publishing Corporation, New York, 47 pp.

Petersen, K.E., (1982) "Silicon as a Mechanical Material," Proc. IEEE 70(5):420–457.

Hayashi, T. (1992), "An Innovative Bonding Technique for Optical Chips Using Solder Bumps That Eliminate Chip Positioning Adjustments," IEEE Trans. Components, Hybrids, and Manufacturing Technol. 15(2):225–230.

Garabedian, R. et al. (1994), "Microfabricated surface plasmon sensing system," Sensors and Actuators A 43:202–207.

Newport Catalog (1994), "Introduction to Positioning Equipment," Newport Corp., Irvine, CA, 18 pp.

*Primary Examiner*—Brian Healy
*Attorney, Agent, or Firm*—Greenlee, Winner & Sullivan, P.C.

[57] ABSTRACT

This invention provides rapid, accurate and repeatable alignment of components in three spatial coordinate directions to within about ±10 µm. It comprises a two-stage kinematic mount and a corresponding two-stage mountable module, each having a macrostage for initial alignment and a microstage for further, high accuracy alignment. The microstage of the mount preferably has either three alignment pins or three constraints and the microstage of the mountable module likewise preferably has either three pins or three constraints, so that the constraints of one component receive the pins of the other. A compliant layer is positioned between the microstage and macrostage of the mountable module. This invention further includes two-stage mount and mountable modules incorporating optical, electrical, mechanical or fluidic elements. In a preferred embodiment, the microstage module has a V-groove fluid flow channel suitable for use in optical flow cytometry.

24 Claims, 5 Drawing Sheets

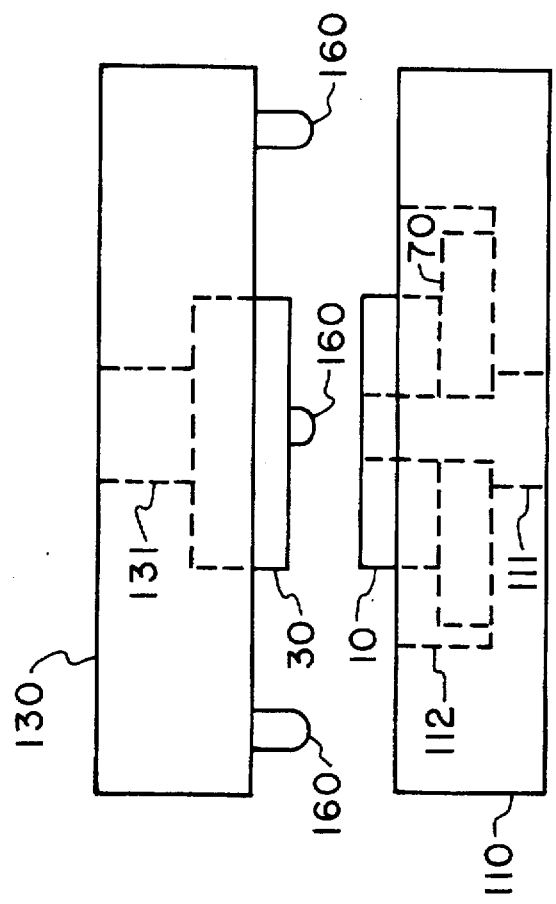

TWO-STAGE KINEMATIC MOUNT

This invention was made with government support under Army research contract DAMD17-94-J-4460 awarded by the U.S. Army. The government has certain rights in the invention.

BACKGROUND OF THE INVENTION

Field of the Invention

This invention relates to rapid, accurate and repeatable alignment of microscale components using a two-stage kinematic mount.

High precision alignment of optical components measuring in the 10 to 1000 μm range is a difficult proposition, particularly when the components must be accurately aligned in three spatial coordinate directions and must be rapidly interchangeable. This problem is encountered in situations such as semiconductor processing wherein a semiconductor wafer must be accurately aligned with a series of masks, and in device assembly wherein components such as semiconductor lasers, optical fibers and planar optical waveguides must be mated.

Optical alignment marks, typically grooves etched in the surface of a semiconductor wafer, can be used in high precision alignment [see, for example, Matsumoto et al., U.S. Pat. No. 5,128,280(1992)]. A light beam is reflected from the alignment marks onto photodetectors. The intensity pattern of the reflected light is indicative of the positioning of the wafer. The wafer is mounted on a translational stage having precision mechanical micrometers or piezoelectric actuators, and manipulated until the correct reflection from the marks is obtained. While accurate, this method is too time consuming to achieve rapid component interchange.

In flip-chip bonding, the surface tension of molten solder is used to align components [Hayashi, IEEE Trans. Components, Hybrids, Manufacturing Tech. 15, 225(1992)]. Each of the two components to be aligned has a plurality of solderable pads on the surface. Solder bumps are placed on the pads of one component and the second component is positioned with its pads abutting the solder bumps. The components are heated to the point of solder reflow and the surface tension of the molten solder automatically aligns the opposing pairs of solder pads without the need for position adjustment. However, this technique provides alignment only in the two lateral dimensions.

Grooves etched in the surface of wafers have been used to provide mechanical alignment. To couple a fiber waveguide with an optical element in a wafer, the fiber can be placed in a guide groove etched in the surface of the wafer [Petersen, Proc. IEEE 70, 420(1982)]. To abut the edges of two wafers containing optical components, guide grooves can be formed in the surface of each wafer and a shared guide pin is laid along the pair of guide grooves [Yanagawa et al., U.S. Pat. No. 5,297,228(1994)].

Purely mechanical alignment methods have also been used to abut the surfaces of two wafers containing optical components. Garabedian et al. [Sensors and Actuators A 43, 202(1994)] etched alignment pits into both the top and bottom wafers and assembled the wafers with beads placed within the alignment pits between the wafers. In another technique [Patent TP 48911(1989)] three grooves were etched in the bottom wafer and the top wafer had three knobs to form a kinematic mount. Both these techniques require that the two wafer surfaces abut, and thus do not allow relatively bulky components, such as a fluid flow channel coverplate, to be placed between the wafers. Due to the assembly requirements, they also do not provide for rapid interchange of components.

BRIEF SUMMARY OF THE INVENTION

This invention provides rapid, accurate and repeatable alignment of components in three spatial coordinate directions to within about ±10 μm. It comprises a two-stage kinematic mount and a corresponding two-stage mountable module, each having a macrostage for initial alignment and a microstage for further, high accuracy alignment. The microstage of the mount preferably has either three alignment pins or three constraints and the microstage of the mountable module likewise preferably has either three pins or three constraints, so that the constraints of one component receive the pins of the other. The macrostage allows a manual operator or automated assembly system to align the components sufficiently close to the desired position that the microstage alignment pins can begin to engage. The macrostage can also use three pins and three constraints, or alternatively it can employ other alignment members such as rails which mate with slots or grooves. The microstage provides highly accurate alignment. Full engagement of the microstage pins is made possible by a compliant layer positioned between the microstage and the macrostage of the mountable module.

During the fabrication of optical, electronic or fluidic elements in semiconductor wafers, the microstage constraints can simultaneously be etched into the surface of the wafer, thus insuring that aligning the wafer also aligns the element fabricated therein. This invention includes two-stage mounts and mountable modules incorporating optical, electrical, mechanical or fluidic elements. In a preferred embodiment, the microstage module has a V-groove fluid flow channel etched therein suitable for use in optical flow cytometry.

BRIEF DESCRIPTION OF THE SEVERAL VIEWS OF THE DRAWING

FIG. 1, comprising

FIG. 2 is a side view of a two-stage kinematic mount ensemble.

FIG. 3, comprising

FIG. 4, comprising

DETAILED DESCRIPTION OF THE INVENTION

The present invention provides a two-stage kinematic mount and a corresponding two-stage mountable module, each having a macrostage for initial alignment and a kinematic microstage for further, high accuracy alignment. The term kinematic mount is used herein for a mount which can be removably coupled with a mountable module and which constrains all six degrees of translational and rotational freedom of the module. The term macrostage is used herein for the larger of the two stages and is preferably large enough to allow facile manual or automated assembly. The term microstage is used herein for the smaller of the two stages and provides greater alignment accuracy, preferably to within 10 µm and more preferably to within 5 µm. The terms mount and mountable module are used herein for two components to be aligned; they are distinguished in that the mountable module has a compliant layer positioned between the microstage and the macrostage. Either the mount or the module can have a larger body, either can contain the mounting pins, and either can be positioned on the top, the bottom, or in non-horizontal orientations.

Figure 1B:
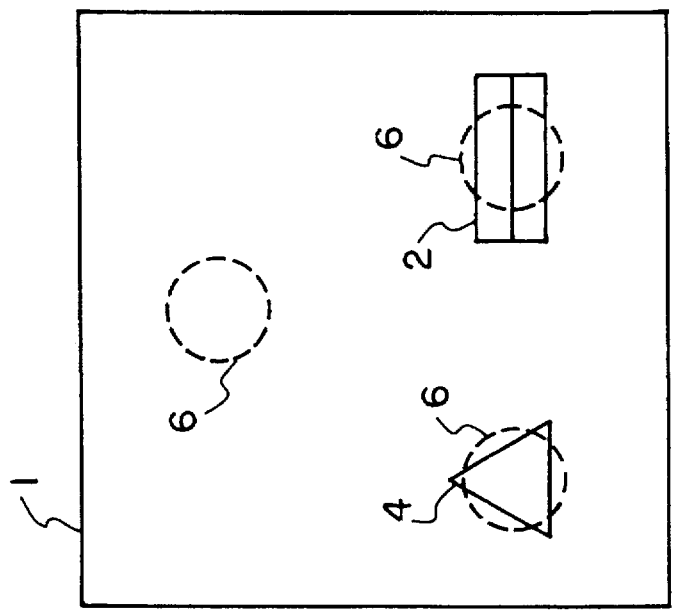
FIGS. 1a–b, shows one stage of the kinematic mount, having (a) three grooves or (b) a pit, a groove and a flat.
Figure 1A:
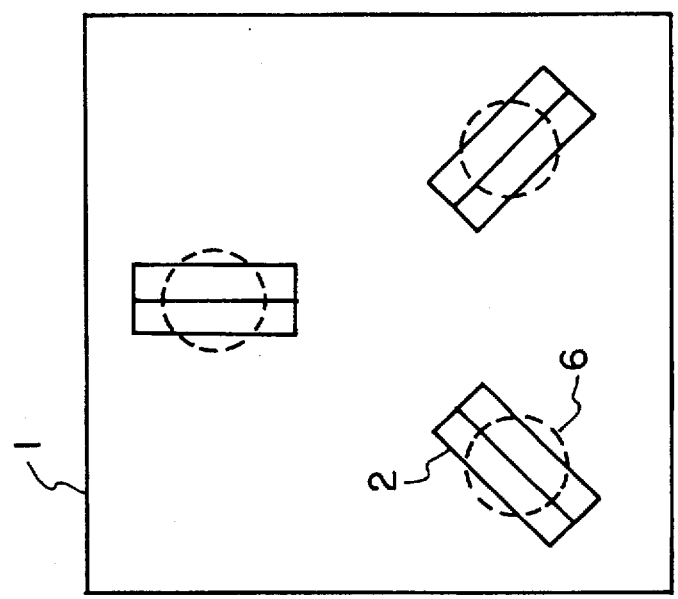

The microstages of the mount and of the mountable module each comprise three kinematic members, where the term kinematic member refers to either a pin or a constraint, such as a groove, pit or flat. The members are positioned on a body, where the term positioned on a body encompasses separate elements attached to the body as well as elements etched, cut or formed into the body. Two exemplary configurations of kinematic mount stages are illustrated in FIG. 1. The mount of FIG. 1a comprises mount body 1 having three grooves 2 positioned thereon. The grooves form 120° angles with one another. Three pins on the corresponding mountable module fit into the grooves at positions 6. In the mount of FIG. 1b, mount body 1 has pit 4, groove 2 and a flat portion positioned thereon. Pins on the mountable module fit into the pit and groove, and onto the flat, at positions 6. The term pin is used herein for any protrusion from the mount body or module body which can couple with a corresponding constraint. The pin can be a unitary part of the body or it can be attached to the body. Exemplary pins include an attached ball, rod, pointed rod, or rod or tube with a sphere on the end.

Many alternative configurations of kinematic mounts known in the art can be employed. The positioning, orientation and shapes of the kinematic members can vary. In the illustrated embodiment the pins are spherical, the grooves are v-shaped and the pit is a three sided pyramid. In a preferred alternative embodiment the pit is a four sided pyramid with which the pin makes three points of contact.

The macrostage can also utilize a kinematic design or, because the requirements for alignment accuracy are less than in the microstage, other alignment techniques known in the art can be employed. For example, instead of pins two dimensional rails can be used to mate with slots or grooves. The term alignment member is used herein for mating elements in the mount and module, including but not limited to kinematic members.

A side view of an embodiment of the two-stage ensemble of this invention, comprising a two-stage mount and two-stage mountable module, is shown in FIG. 2. The mount comprises macrostage body 130 having three macrostage pins 160 thereon, and microstage body 30 having three microstage pins (not illustrated) thereon. The macrostage and microstage bodies are illustrated as separate elements; they can alternatively be a unitary structure. In this embodiment the macrostage body includes optional access port 131. The microstage body can also have an access port, for example to bring light or fluid to the front surface of the microstage body. The mountable module comprises macrostage body 110 having three constraints (not illustrated) thereon, microstage body 10 having three constraints (not illustrated) thereon, and compliant layer 70 positioned therebetween. The compliant layer is any flexible material which allows movement of the microstage body relative to the macrostage body in all three dimensions. It can be, for example, a flexible polymer sheet such as silicone, or a layer of a viscous material such as a grease or gel. In this embodiment the compliant layer and the microstage are positioned in optional recess 112. The optional access port 111 is formed through all the layers of the mountable module. In this embodiment, the compliant layer can further function as a gasket to seal a fluid inlet. In the illustrated embodiment the compliant layer is larger than the microstage body. It can alternatively be smaller so that there is less resistance to microstage movement and greater pressure to the seal.

Figure 3B:
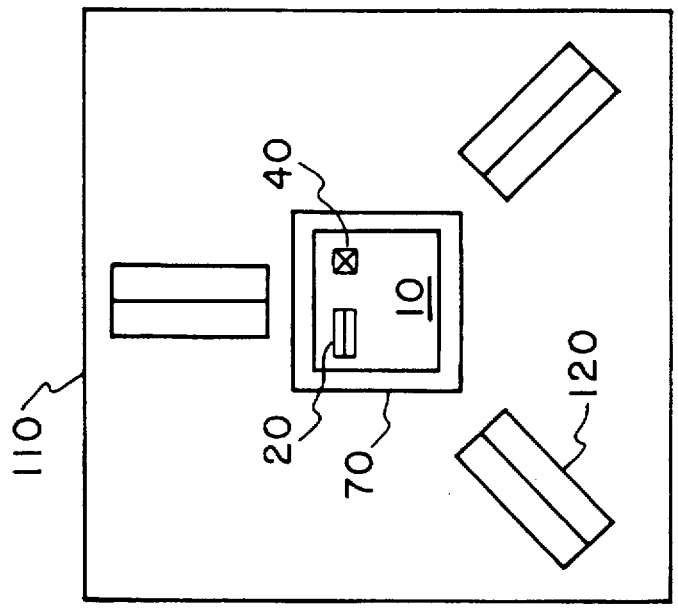
FIGS. 3a–b, is a two-stage kinematic mount ensemble, showing plan views of (a) the two-stage mount and (b) the two-stage mountable module.
Figure 3A:
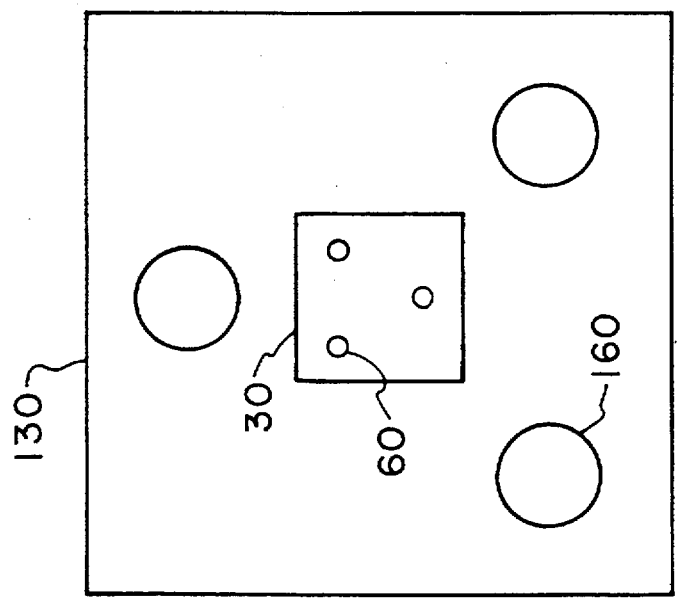

The separate elements of an embodiment of a preferred two-stage ensemble are shown in plan view in FIG. 3a–b. The mount (FIG. 3a) comprises macrostage body 130 with pins 160, and microstage body 30 with pins 60. The mountable module (FIG. 3b) comprises macrostage body 110 with constraining grooves 120, and microstage body 10 with constraining pit 40, groove 20 and with a flat portion to receive a third pin. Compliant layer 70 is positioned between the macrostage and the microstage of the module.

The macrostage serves to allow rapid manual or automated assembly of the ensemble. It must also provide sufficient alignment accuracy that the microstage can begin to engage. In order for pins 60 to engage groove 20 and pit 40, the pins must fall, at worst, on the edges of the pit and groove. This means that the macrostage alignment must be accurate to within half the diameter of the pit or groove. If microstage module body 10 is a silicon wafer, the groove diameter is preferably <800 µm to prevent wafer fragility, requiring the macrostage alignment accuracy to be within 400 µm. In practice, the macrostage can provide alignment accuracy better than 100 µm and still be rapidly assembled by hand.

In the preferred embodiment of FIG. 3b, macrostage body 110 is made of plastic or metal, and microstage body 10 is a silicon <100> wafer. For the macrostage, either of the designs of FIGS. 1a–b is suitable. For the microstage the design of FIG. 1b, is preferred. Anisotropic etching of silicon <100> proceeds along <111> planes to creates v-shaped grooves and four-sided pyramidal pits. The design of FIG. 1a, having three grooves oriented at 120° with respect to each other, cannot be anisotropically etched into silicon <100> because the <111> planes are at right angles to each other. A modified version of the three-groove module can be etched in which the grooves are parallel or at right angles to each other. However, if the components undergo thermal expansion, the 120° orientation is unique in providing alignment stability. The illustrated pit, groove and flat design is stable with thermal expansion.

To assemble the mountable module, the microstage must be positioned with respect to the macrostage with sufficient accuracy that coupling with the macrostage of the mount allows the microstages to engage. In the embodiment of FIG. 2 the positioning can be accomplished by an accurate match of the size of body 10 with recess 112. Alternatively, an assembly mount, shown in FIG. 4, can be used to provide accurate placement of the microstage onto the macrostage without requiring accurate control of the microstage body dimensions.

Figure 4A:
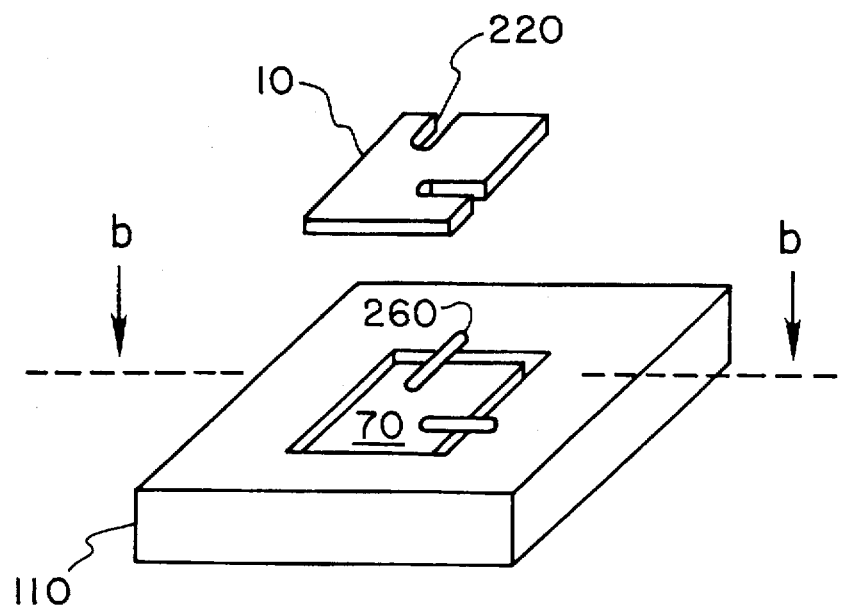
FIGS. 4a–c, is an assembly mount used to assemble the microstage to the macrostage of mountable module. The module is shown (a) during assembly, (b) after assembly and (c) after mating with the two-stage kinematic mount.

FIG. 4a shows the module before assembly. Guide slots 220 are formed in microstage body 10, preferably in the same etching step as the microstage constraints (not illustrated). Guide rails 260 are attached to macrostage body 110. In the illustrated embodiment the rails are cylindrical tubing. They can alternatively be, for example, rectangular metal plates. The diameter of the rails must be sufficiently less than the width of the guide slots (for example 50μm less) to allow movement of the microstage body when coupling the module with the mount. The macrostage pins or constraints are not illustrated.

Figure 4B:
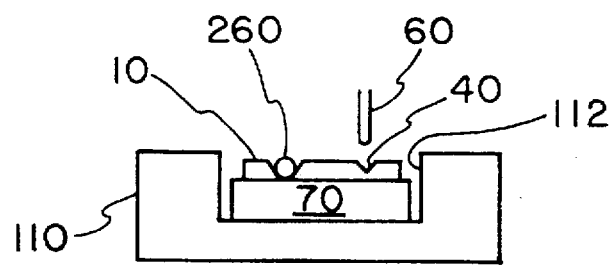
Figure 4C:
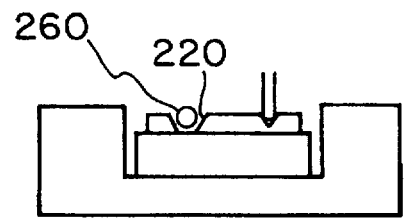

The assembled mountable module is shown in cross section in FIG. 4b. The guide rails are flush with the surface of the macrostage body, which has grooves to hold the rails. The top surface of compliant layer 70 is at the same level as the bottom of the rails. Recess 112 accommodates the compliant layer. When the microstage constraints of the module (represented by pit 40) engage with the microstage pins 60 of the mount, the force pushes microstage body 10 down against the compliant layer (FIG. 4c). This causes guide rails 260 to disengage from slots 220, allowing greater movement of the microstage body during engagement with the mount.

The alignment members of the macrostage mount of this invention can be rails and slots such as those illustrated in the assembly mount. In fact, the rails of the assembly mount can double as alignment members for the macrostage mount. In this case the rails can be rectangular plates which fit through and extend beyond the microstage body of the mounting module. The mating alignment members of the macrostage of the mount are slots or grooves which receive the rails.

Figure 5:
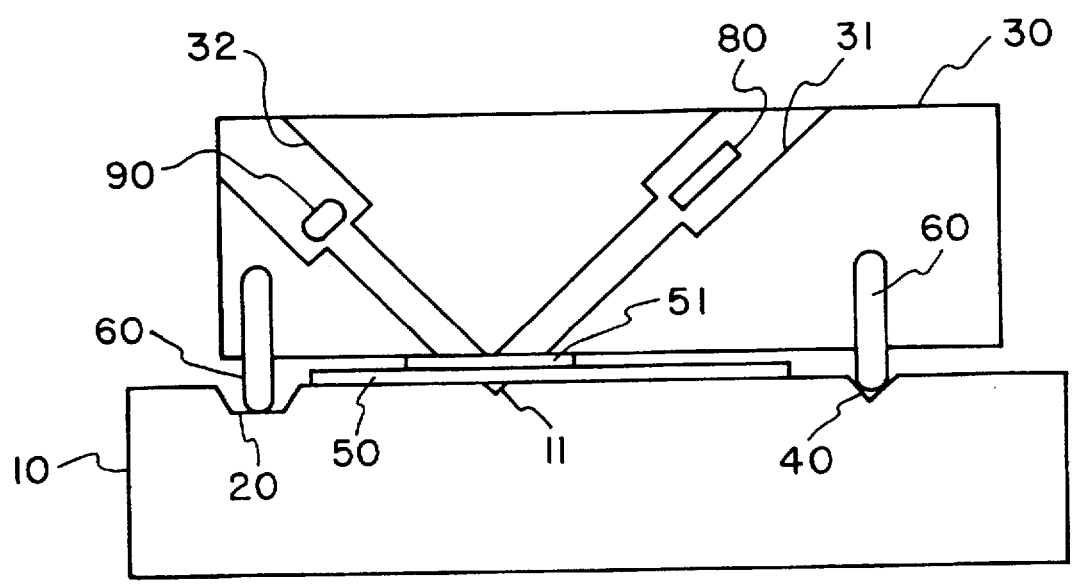
FIG. 5 is a cross section of the microstage of a two-stage kinematic mount ensemble used to connect a flow module to a flow cytometer optical head.

FIG. 5 illustrates a cross section of the microstage of a kinematic mount ensemble used to connect a flow module to a flow cytometer optical head. Note that this drawing is not a true cross section in that not all of these elements lie in a single plane. The macrostage and compliant layer, which are not illustrated, are positioned outside of the microstage. The mount microstage body 30 houses the flow cytometer optical head, comprising laser 80 and photodetector 90, mounted within access ports 31 and 32, respectively. Body 30 can be molded or machined metal or plastic. The microstage of the mountable module is the flow module of the flow cytometer. Body 10 is a silicon <100> wafer having v-groove fluid flow channel 11 etched therein. The module body has kinematic constraints, pyramidal pit 40 and v-groove 20, etched therein. Pyrex coverplate 50 is bonded onto body 10 to seal the flow channel. In operation, laser 80 illuminates a sample fluid flowing through channel 11, and scattered or fluorescent light is collected by photodetector 90. In the preferred embodiment, a transparent, compliant index-matching material 51, such as silicone gel, is interposed between the optical head and the coverplate. The flow cytometer optical head and flow module are described in greater detail in U.S. patent application Ser. No. 08/534,515, filed Sep. 27, 1995, which is hereby incorporated by reference in its entirety.

The flow cytometer apparatus exploits two advantages of the two-stage mount of the present invention. The protruding pins allow the surfaces of two components to be aligned without requiring direct contact between the two surfaces. This allows elements, such as the coverplate, to be positioned between the two surfaces. In spite of the variable thickness of pyrex coverplates, the kinematic mount provides precise alignment between the optical head and the flow module.

A second advantage is that the microstage constraints can be etched into the microstage body simultaneously with the flow channel, using a single mask. This guarantees reproducible alignment of the flow channel from one flow module to the next. After use, the entire flow module can be discarded and replaced with a new one. In replacing the flow module, the macrostage provides rapid engagement of the microstage and the microstage provides the high precision alignment.

The flow cytometer illustrates one application of the two-stage kinematic mount of this invention. The kinematic mount can also find utility in many application areas where the precise and repeatable alignment of individual microelectromechanical system (MEMS) components is required or where the interface of macro-system elements to MEMS components is required. It provides a particular advantage when the elements are fabricated simultaneously with kinematic constraint fabrication, so that the modules can be reproducibly interchanged. In addition to fluidic and optical elements, pneumatic, electrical and mechanical elements can be coupled. For example, the mount can be used to align flow ports in multi-layer stacks, orifices, motors, pumps, valve seats, gears, electrical contacts, lenses, and components on a micro-optical bench.

The two-stage kinematic mount of this invention has been illustrated with a few preferred embodiments. As will be obvious to those skilled in the art, numerous alternative embodiments fall within the spirit and scope of this invention. For example, the mount ensemble has been illustrated in a horizontal orientation wherein gravity maintains the coupling between the mount and the mountable module. Alternatively, other orientations can be used and the coupling can be maintained by an element such as a spring or a clip. The macrostage has been illustrated surrounding the microstage. This is a preferred, but not required, positioning. For example, the macrostage members can be on the back of the mount facing in the opposite direction from the microstage members or can be on the edges of the macrostage body facing radially away from the microstage members. For use in a stacked ensemble there can be two-stage mounts on both sides of a wafer, or there can be a two-stage mount on one side and a single stage macromount on the other side, for example for fluid connection. Multiple independent microstages can share a single macrostage. Each stage of the mount ensemble has been illustrated with all three pins on one component. Alternatively each component can have a mixture of pins and constraints, totalling three kinematic members, within each stage. The invention has been illustrated with true kinematic mounts which provide in each stage exactly six points of contact between the two components. Semi-kinematic mounts having, for example, linear or planer contacts rather than point contacts can also be employed.

EXAMPLE

The two-stage kinematic mount of this invention was used to couple a fiber optic with a fluid flow channel. The ensemble followed the design of FIG. 3. The two-stage mount comprised a plexiglass body having the three macrostage alignment pins and the three microstage alignment pins attached thereto. The pins were made of stainless steel surgical tubing with chrome steel spheres (sphericity 0.6μm) soldered to the end. The sphere diameters were 3/16in. for the macrostage and 1/32in. for the microstage. A 1/32in. diameter hole drilled through the plexiglass body, exiting in the center of the microstage pins, was used to mount an optical fiber.

The macrostage of the mountable module was a plexiglass body having three grooves at 120° to each other cut therein. The microstage body was a silicon wafer having both the fluid flow channel and the pit and groove etched in the surface thereof. A pyrex coverplate was bonded to the top of the wafer to cover the flow channel but not the kinematic constraints. Holes etched through the silicon wafer and matching holes drilled through the plexiglass allowed fluid to be pumped through the flow channel. A compliant layer of DOW Sylgard 182 polymer was sandwiched between the plexiglass macrostage body and the silicon microstage body.

The two-stage mountable module was manually mounted on the two-stage mount. The alignment accuracy was measured using an optical microscope. For a given microstage module the alignment was reproducible within ±8 µm. For interchanging modules the alignment was reproducible within ±10 µm.

What we claim is:

1. A two-stage mountable module for coupling with a two-stage kinematic mount, said mount having a macrostage mount and a microstage mount, said module comprising:

a macrostage module comprising a macrostage body and further comprising a plurality of macrostage alignment members positioned on said macrostage body;

a microstage module comprising a microstage body and further comprising three microstage kinematic members positioned on said microstage body; and a compliant layer positioned between and in contact with said macrostage body and said microstage body;

wherein said macrostage and microstage modules are adapted to be removably coupled with said macrostage and microstage mounts, respectively.

2. The module of claim 1 wherein said microstage body is a silicon wafer.

3. The module of claim 2 wherein said microstage kinematic members comprise a pit, a groove and a flat on the surface of said silicon wafer.

4. The module of claim 3 further including a fluid flow channel etched into said silicon wafer.

5. The module of claim 2 further comprising an element fabricated on or in said silicon wafer, said element selected from the group consisting of a fluid flow channel, a semiconductor laser, a photodetector, an optical waveguide, and a fiber optic guide groove.

6. The module of claim 1 wherein said macrostage body is made of plastic or metal.

7. The module of claim 1 wherein said plurality of macrostage alignment members comprises three macrostage kinematic members.

8. The module of claim 7 wherein said macrostage kinematic members are selected from the group consisting of (1) three pins, (2) three grooves, and (3) a pit, groove and flat.

9. The module of claim 1 wherein said plurality of macrostage alignment members are selected from the group consisting of (1) two rails and (2) two slots.

10. The module of claim 1 wherein said macrostage body has an access port therein, providing access to said microstage body.

11. The module of claim 1 wherein said compliant layer is a polymer sheet.

12. The module of claim 1 further comprising an assembly mount for positioning said microstage body on said macrostage body.

13. The module of claim 12 wherein said assembly mount comprises two rails positioned on said macrostage body and two slots positioned on said microstage body.

14. A two-stage kinematic mount for coupling with a two-stage mountable module, said module having a macrostage module and a microstage module said mount comprising:

a body;

a macrostage mount comprising a plurality of macrostage alignment members positioned on said body; and a microstage mount comprising three microstage kinematic members positioned on said body;

wherein said macrostage and microstage mounts are adapted to be removably coupled with said macrostage and microstage modules, respectively.

15. The mount of claim 14 wherein said body comprises a macrostage body having said macrostage alignment members positioned thereon and further comprises a microstage body, attached to said macrostage body, having said microstage kinematic members positioned thereon.

16. The mount of claim 15 wherein said microstage body is a silicon wafer.

17. The mount of claim 16 further comprising an element fabricated on or in said silicon wafer, said element selected from the group consisting of a fluid flow channel, a semiconductor laser, a photodetector, an optical waveguide and a fiber optic guide groove.

18. The mount of claim 16 wherein said macrostage body has an access port therein, providing access to said microstage body.

19. The mount of claim 14 wherein said plurality of macrostage alignment members comprises three macrostage kinematic members.

20. The mount of claim 19 wherein said microstage kinematic members and said macrostage kinematic members are each selected from the group consisting of (1) three pins, (2) three grooves, and (3) a pit, groove and flat.

21. The mount of claim 20 wherein said microstage kinematic members comprise three pins.

22. The mount of claim 14 further comprising an element positioned on or in said body, said element selected from the group consisting of a fluid flow element, a light source, a photodetector, an optical waveguide, a fiber optic, a fiber optic mount, an electrical element, a mechanical element, an optical element and a mask.

23. The mount of claim 14 wherein said body has an access port therein, providing access to the area in the center of said microstage members.

24. A two-stage kinematic mount ensemble comprising the two-stage kinematic mount of claim 14 and further comprising:

a macrostage module comprising a macrostage body and further comprising a plurality of macrostage alignment members positioned on said macrostage body;

a microstage module comprising a microstage body and further comprising three microstage kinematic members positioned on said microstage body; and a compliant layer positioned between and in contact with said macrostage body and said microstage body;

wherein said macrostage and microstage modules are adapted to be removably coupled with said macrostage and microstage mounts, respectively.

* * * * *